United States Patent [19]
Milinkovic et al.

[11] Patent Number: 6,048,578
[45] Date of Patent: Apr. 11, 2000

[54] CLOSED LOOP CARBON MONOXIDE SELF-CONTAINED NICKEL CARBONYL DEPOSITION PROCESS

[75] Inventors: Miroslav Milinkovic, Toronto; Rodney P. Reynolds, Bolton; Dmitri S. Terekhov, Newmarket, all of Canada

[73] Assignee: Chemical Vapour Deposition Systems, Inc., Toronto

[21] Appl. No.: 09/185,519

[22] Filed: Nov. 4, 1998

[51] Int. Cl.[7] .................................................. C23C 16/16
[52] U.S. Cl. ...................... 427/252; 427/255.23; 427/345
[58] Field of Search ................................... 427/252, 345, 427/255.23

[56] References Cited

U.S. PATENT DOCUMENTS

| 3,294,059 | 12/1966 | Barnes . | |
|---|---|---|---|
| 3,688,474 | 9/1972 | Head et al. | 95/193 |
| 4,769,054 | 9/1988 | Steigman | 62/601 |
| 5,766,683 | 6/1998 | Waibel | 427/252 |

FOREIGN PATENT DOCUMENTS

| 2 206 217 | 11/1998 | Canada . |
|---|---|---|
| 11 04 066 | 4/1961 | Germany . |

*Primary Examiner*—Timothy Meeks
*Attorney, Agent, or Firm*—Jeffrey S. Melcher

[57] ABSTRACT

A closed loop, carbon monoxide self-contained preferably continuous process and apparatus for the production of nickel or nickel coated objects by nickel vapor deposition (NVD), comprising placing an object to be treated with nickel carbonyl in a deposition chamber; feeding a gaseous mixture of nickel carbonyl and carbon monoxide to the chamber; producing the nickel or nickel coated object and a nickel carbonyl-depleted gaseous mixture; removing nickel carbonyl from the nickel carbonyl-depleted gaseous mixture in a primary and subsequent secondary condensation unit and, preferably, a tertiary condensation unit to produce an essentially nickel carbonyl-free gas. The secondary and tertiary condensation units operably freeze out and subsequently thaw nickel carbonyl and most preferably each comprises a pair of units linked in parallel arrangement operative in alternating, alternate freeze-thaw modes. Carbon monoxide-containing gas is recycled to a nickel carbonyl reactor. The process and apparatus provides a more economic to operate, safe and more operably reliable than prior art NVD processes.

8 Claims, 1 Drawing Sheet

6,048,578

CLOSED LOOP CARBON MONOXIDE SELF-CONTAINED NICKEL CARBONYL DEPOSITION PROCESS

FIELD OF THE INVENTION

This invention relates to nickel vapour deposition processes for use in the manufacture of nickel or nickel coated objects, particularly, to effluent gas recycling in said processes; and to apparatus for use in said processes.

BACKGROUND TO THE INVENTION

Chemical vapour deposition is a well-known method for depositing films or coatings on substrates. One known chemical vapour used for depositing a nickel film or coating on a substrate is nickel carbonyl in the so-called Nickel Vapour Deposition process (NVD). Typically, the substrates to be nickel coated are heated within a reaction or deposition chamber to a predetermined suitable reaction temperature, typically 110° C.–180° C. in an atmosphere of nickel carbonyl, $Ni(CO)_4$. The nickel carbonyl reacts at the surface of the heated substrate to deposit the Ni film or coating thereon.

Nickel carbonyl from a liquid supply tank flows through a vapourizer where it is converted into a gas stream to which gaseous stream may be added a small amount of carrier gas, such as carbon monoxide.

Typically, nickel carbonyl vapour is continuously introduced to the deposition chamber, wherein it reacts to produce elemental nickel and carbon monoxide by-product. The spent gas is continuously purged from the chamber in order to maintain proper circulation of reactive nickel carbonyl across the surfaces of the substrates. The substrates may be heated according to well-known methods, such as heat conduction, radiation, inductance and the like.

The spent gases which contain nickel carbonyl in excess of 30% W/W generally undergo a nickel carbonyl reclamation process to substantially remove the nickel carbonyl before the spent stream enters an incinerator. The incinerator is used to ensure complete thermal destruction of nickel carbonyl prior to letting the combustion products into the environment.

The recovered nickel carbonyl is, typically, passed to a liquid supply tank. Nickel carbonyl is produced in a nickel carbonyl generator containing nickel powder of a suitable morphology in a packed bed through which is passed fresh carbon monoxide gas from a storage cylinder to generate fresh nickel carbonyl. The gaseous mixture is passed through a condenser wherein the nickel carbonyl is condensed and fed to a storage tank. A compressor recirculates the resultant gas back to the nickel carbonyl generator.

The above general process represents a typical operation involving, in effect two distinctive processes for generating, reacting and re-generating nickel carbonyl with non-recycled carbon monoxide.

The above process, thus suffers from the disadvantages of wasting carbon monoxide generated as a by-product by the burning thereof in an incinerator and, also, the need to have the incinerator continuously operating in a continuous NVD process. Moreover, nickel oxide is produced in the incinerator during nickel carbonyl combustion.

U.S. Pat. No. 5,766,683, issued Jun. 16, 1998, to New American TEC describes a reclaim system for cooling the gases received from the plating system and cooling them to a temperature just above the freezing point of nickel carbonyl to condense out and recover the liquid carbonyl. The reclaim system includes a reclaim condenser and a vapor recovery gas receiver for receiving vapors from the reclaim system. The vapor recovery system includes a first stage compressor operatively connected to a first stage receiver for pressurizing the vapor to about 25 PSIG, and a first stage condenser operatively connected to the first stage compressor for cooling the vapors. A conduit communicates the vapor recovery system to the reactor system for forwarding the cooled vapors to a recycle pump receiver in the reactor system. A further compressor is provided in the reactor system for compressing the gases from the recycle pump receiver to about 65 PSIG. This system recovers and recycles substantial amounts of the nickel carbonyl and wherein the requirements for carbon monoxide are substantially reduced. However, U.S. Pat. No. 5,766,683 does not satisfactorily address the full recovery of nickel carbonyl for recycle within the system.

There is, therefore, a need for an improved NVD process which is more economic, safe and reliable.

SUMMARY OF THE INVENTION

It is an object of the present invention to provide an improved NVD process which is more economic to operate, safe and more operably reliable than present prior art NVD processes.

It is a further object of the invention to provide a more environmentally acceptable NVD process having a reduced need for use of a carbon monoxide incinerator during operations.

It is a yet further object of the invention to provide apparatus for use in aforesaid NVD processes.

Accordingly, in one broad aspect the invention provides a closed loop, carbon monoxide self-contained process for the production of nickel or a nickel-coated object by the nickel vapour deposition process, comprising (a) placing an object to be treated with nickel carbonyl by said nickel vapour deposition process in a deposition chamber;

(b) feeding a gaseous mixture comprising nickel carbonyl and carbon monoxide to said deposition chamber;

(c) depositing nickel on said object to produce said nickel or nickel-coated object in said chamber and a nickel carbonyl-depleted gaseous mixture;

(d) removing said nickel carbonyl-depleted gaseous mixture from said chamber;

(e) removing nickel carbonyl from said nickel carbonyl-depleted gaseous mixture in a primary nickel carbonyl condensation unit to produce a first reduced-concentration nickel carbonyl-containing gas; the improvement comprising (f) condensing said first reduced-concentration nickel carbonyl-containing gas in a secondary condensation unit operative in an alternate freeze-thaw mode by, stepwise, (i) freezing said first reduced-concentration nickel carbonyl-containing gas to produce a first solid nickel carbonyl;

(ii) melting said first solid nickel carbonyl to produce a first liquid nickel carbonyl;

(iii) removing said first liquid nickel carbonyl from said secondary condensation unit to produce a second reduced concentration nickel carbonyl-containing gas having a nickel carbonyl concentration of less than 5 V/V %; and (g) feeding said second reduced-concentration nickel carbonyl-containing gas to a nickel carbonyl reactor containing nickel powder to produce a fresh gaseous mixture comprising fresh nickel carbonyl and carbon monoxide.

Two process loops, one nickel carbonyl generation and the other decomposition are connected via recycled carbon monoxide and liquid carbonyl transfer links. The two loops can operate independently from each other or in tandem as is preferred for reasons outlined hereinbefore.

The preferred nickel carbonyl reclaim system of use in the invention provides for successful operation and integration of the two loops. After the deposition chamber there is a preferred 3-stage carbonyl reclamation process. In the first or primary condensation unit nickel carbonyl is condensed. The secondary reclamation unit comprises a pair of condensation units which essentially reduces the nickel carbonyl concentration to below 1%. The double units, alternatively and simultaneously, freeze or thaw out nickel carbonyl. The switching from on unit to the other is accomplished by a suitable nickel carbonyl concentration detection system in the process stream.

Accordingly, the invention provides in a preferred embodiment the process as hereinbefore defined, for continuous operation having a plurality of said secondary condensation units linked in parallel arrangement and operative in alternating, alternate freeze-thaw modes.

In the next stage, carbon monoxide-nickel carbonyl gas mixture is compressed and traces of nickel carbonyl are removed by a $3^{rd}$ reclaim system comprising a pair of condensation units, which reclaims traces of nickel carbonyl to yield pure carbon monoxide wherein carbon monoxide was the sole carrier gas. Reclaim 3 system operates on the same switching principles as reclaim 2.

Accordingly, in a more preferred embodiment, the invention, as hereinabove defined, further comprising condensing said second reduced-concentration nickel carbonyl-containing gas in a tertiary condensation unit operative in an alternate freeze-thaw mode, by stepwise, (iv) freezing said second reduced-concentration nickel carbonyl-containing gas to produce a second solid nickel carbonyl;

(v) melting said second solid nickel carbonyl to produce a second liquid nickel carbonyl;

(vi) removing said second liquid nickel carbonyl from said tertiary condensation unit; to produce a third reduced-concentration nickel carbonyl-containing gas having a nickel carbonyl concentration of less than 500 p.p.m.; and (h) feeding said third reduced-concentration nickel carbonyl-containing gas to a nickel carbonyl reactor containing nickel powder to produce a further fresh gaseous mixture comprising nickel carbonyl and carbon monoxide.

Selection of suitable carbon monoxide diaphragm type compressors is most preferred for safe running of the process.

The reactor in the carbonyl generation loop can have a continuous feed of nickel powder. Suitable controlled reactor bed temperature is maintained via a separate heat management system. Highly toxic reactor residue is handled by an auxiliary suction system.

Transfer of liquid nickel carbonyl during the process between generation to decomposition loop is accompanied without pumps by pressurizing storage cylinders.

In a further feature, the invention provides a method of recovering nickel carbonyl in a nickel deposition system which includes a reactor system, a plating system, a reclaim system and a vapor recovery system comprising the steps of producing liquid nickel carbonyl, vaporizing the liquid nickel carbonyl and applying the vaporized nickel carbonyl to a substrate to deposit nickel thereon and to release carbon monoxide, cooling the gases after the deposition of nickel on said substrate to a temperature below the freezing point of nickel carbonyl to condense out nickel carbonyl to a solid; subsequently allowing said solid nickel carbonyl to melt and recovering liquid nickel carbonyl from said solid nickel carbonyl.

In a further aspect the invention provides an improved nickel deposition apparatus having a nickel carbonyl reactor unit, a nickel deposition unit, a nickel carbonyl vapour recovery system having a primary condensation unit and a secondary condensation unit the improvement comprising means for freezing nickel carbonyl to a solid within said secondary condensation unit, means for melting said solid nickel carbonyl to a liquid; means for recovering said liquid nickel carbonyl; and means for recovering nickel carbonyl depleted gaseous mixture.

Preferably, the apparatus has a plurality, preferably, a pair of said secondary condensation units linked in parallel and means for operatively controlling said units in alternating, alternate nickel carbonyl freeze-thaw modes.

More preferably, the apparatus further comprises a tertiary condensation unit for freezing nickel carbonyl out of said recovered nickel carbonyl-depleted gaseous mixture to a solid state, means for melting said frozen nickel carbonyl to a liquid and means for recovering said liquid nickel carbonyl.

Yet more, preferably, the apparatus comprises a pair of said tertiary condensation units linked in parallel and means for operatively controlling said units in alternating, alternate nickel carbonyl freeze-thaw modes.

BRIEF DESCRIPTION OF THE DRAWINGS

In order that the invention may be better understood, a preferred embodiment will now be described by way of example only wherein.

DETAILED DESCRIPTION OF A PREFERRED EMBODIMENT

Figure 1:
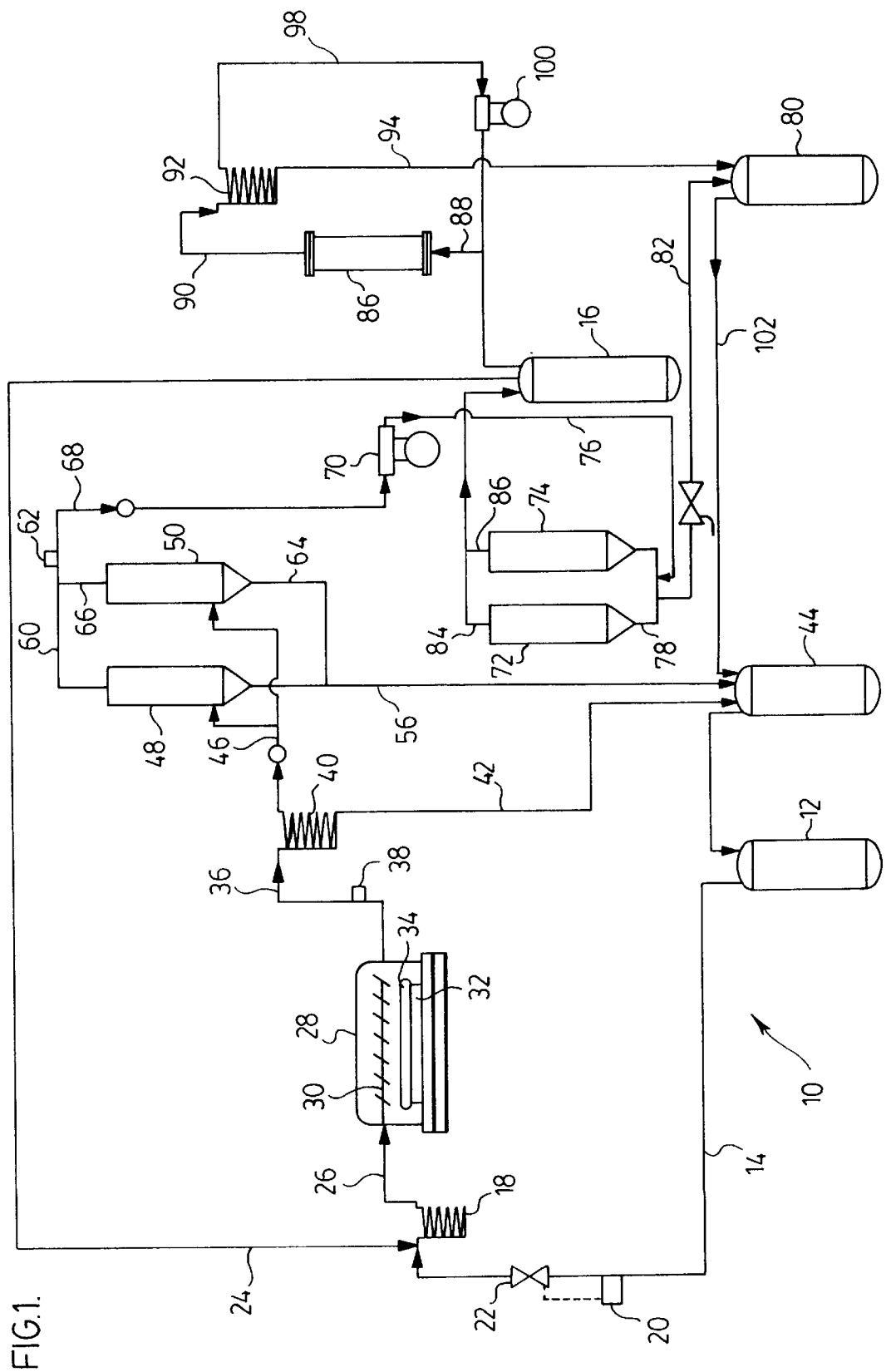
FIG. 1 represents a schematic flow sheet of a process and apparatus according to the invention.

FIG. 1 shows generally as 10, an apparatus and process flow sheet according to the invention.

Liquid nickel carbonyl from storage tank 12 is passed at ambient temperature through conduit line 14 at 40 psi with carbon monoxide carrier gas prior to entering vaporizer 18. The liquid nickel carbonyl flow rate in conduit 14 is measured by a mass flow meter 20, which sends the information to a flow control valve 22 whereby the flow is controlled and adjusted to the desired value. Carbon monoxide carrier gas from carbon monoxide storage tank 16 (84) is mixed from line 24 with the nickel carbonyl to form a 10% CO W/W 90% $Ni(CO)_4$.

Vaporizer 18 vaporizes the liquid nickel carbonyl to a temperature of approximately 87° C. The vaporized mixture is passed through heated conduit 26 to deposition chamber 28, wherein the gas is dispersed through a manifold 30 to contact a heated mandrel 32, having a substrate 34 at a temperature of approximately 180° C. At this temperature, the nickel carbonyl decomposes at the surface of substrate 34 to produce a nickel metal coating on substrate 34. The temperature and residence time of the gaseous mixture in the chamber is such as to effect about a 60% nickel carbonyl decomposition rate. The remaining non-decomposed nickel carbonyl, CO carrier gas and CO produced from the decomposition exits chamber 28 through heated conduit 36 at about 60° C. to a refrigeration unit 40, wherein most of the nickel carbonyl is liquefied and fed through line 42 to storage tank 44. The gas concentration in line 36 is measured by a UV gas concentration cell meter (not shown), and, typically, has a nickel carbonyl concentration ranging from 30–80% V/V, temperature of between 82–85° C. and a pressure of about 0.05 bar..

The gaseous mixture exiting unit 40, typically, has a nickel carbonyl concentration of between 6.5–8.0 V/V %, temperature of −15° to −17° C., pressure of about 0.05 bar, and is passed through conduit 46 and then to one of two refrigerated reclamation units 48 or 50 through lines 52 or 54, respectively, as hereinbelow explained.

Units 48, 50 are identical in construction and operation and represent a pair of refrigeration units which operate in parallel in distinct freezing cycles, from either a "freezing of nickel carbonyl" mode or a "thawing of carbonyl" mode as may be selected. The units in their freeze mode, typically, provide solid nickel carbonyl at a temperature selected from −55° to −58° C. In operation, when unit 48 is in its freezing mode, i.e. operating at its coldest temperature, exhaust gas from conduit 46 is passed through conduit 52 to unit 48, wherein the vast majority of the nickel carbonyl in the gas is frozen. Small amounts of nickel carbonyl gas pass through unit 48 until either the back-pressure in the system exceeds a pre-determined value, or if the nickel carbonyl gas level passing through line 60 exiting unit 48 exceeds a pre-determined level as measured by UV analyzer 62. Typically, the gaseous mixture in line 60 has a nickel carbonyl concentration less than 5 V/V %, and generally of between 0.35–0.55 V/V % and a temperature of between 15° to 20° C. at a pressure of about 30 bar after compression as hereinbelow described.

When either of the above two conditions is met, other unit 50 is switched to the freezing mode and the exhaust gas flow is switched to unit 50. First unit 48 is then switched over to the "thaw" mode which means that the unit freezing system is switched off and the unit heaters (not shown) are turned on. The thaw mode melts the frozen nickel carbonyl into a liquid form, which is gravity drained to storage tank 44 via line 56. The above procedure in respect of unit 50 occurs when unit 50 reaches its critical condition whereby the thaw/freeze process switches back to the original thaw setting with liquid nickel carbonyl dropping through conduits 64 and 56 into storage tank 44.

Thus, further nickel carbonyl-depleted exhaust gas leaves units 48 and 50 through lines 60, 66, respectively, to pass through common line 68 to a diaphragm compressor 70 to provide a compressed gas mixture. The compressed gas passes subsequently through an additional or third reclaiming system consisting of dual refrigeration units 72, 74 analogous to units 48, 50 and related analogous conduits so designed as to be identical in operation to reclaim system 2 with the exception that reclaim system 3 operates at a higher pressure. Thus, units 72,74 are identical in constructions and operation and represent a pair of refrigeration units which also operate in parallel in distinct freezing cycles, from either a "freezing of nickel carbonyl" mode or a "thawing of carbonyl" mode as may be selected. In operation, when unit 72 is in its freezing mode, i.e. operating at its coldest temperature, compressor 70 exhaust gas from conduit 76 is passed through conduit 78 to unit 72, wherein the vast majority of the nickel carbonyl in the gas is frozen out. Essentially, nickel carbonyl-free gas passes out of unit 72 until the back-pressure in the system exceeds a pre-determined value. Typically, the nickel carbonyl is at a concentration of less than 500 p.p.m. and, generally, between 100–200 p.p.m., at a gaseous mixture temperature of about −50° C. and pressure of 30 bar.

When the above condition is met, refrigeration unit 74 is switched to its freezing mode and conduit 76 exhaust gas flow is switched to unit 74. First unit 72 is then switched over to its "thaw" mode, which means that its unit freezing system is switched off and its unit heaters (not shown) are turned on. In a thaw mode, the frozen nickel carbonyl melts into a liquid, which is then transferred to storage tank (80) via line 82. The above procedure in respect of unit 74 is conducted until unit 74 reaches its critical condition whereby the thaw/freeze process is switched back to its original thaw setting, with the resultant liquid nickel carbonyl being subsequently transferred through conduit 82 into storage tank 80.

Thus, further essentially nickel carbonyl-free compressed exhaust gas leaves units 72 and 74 through lines 84, 85, respectively, to pass to carbon monoxide storage tank 16. Tank 16 is also a reservoir for a carbon monoxide supply to nickel carbonyl producer reactor 86 containing a bed of nickel powder raw material. Reactor 86 receives carbon monoxide from tank 16 through line 88 and operates at a temperature selected from 70°–115° C. The addition of CO through line 88 provides for the production of nickel carbonyl, wherein the flowthrough of CO depends on the reactivity of the nickel powder, i.e. the greater the production rate, the more CO that is consumed.

Regenerated nickel carbonyl/CO mixture exits reactor 86 through line 90 to nickel carbonyl liquid condenser 92 operating at a temperature of between −18° and 0° C., wherein liquid nickel carbonyl is condensed and gravity fed through conduit 94 to storage tank 96. The resultant gas mixture exits condenser 92 through line 98 to generator recirculating compressor 100, which recycles the gas back to reactor 86 for nickel carbonyl production until the nickel powder is fully converted to nickel carbonyl.

Liquid nickel carbonyl is subsequently transferred from storage tank 96 through conduit 102 to storage tanks 44 and 12, as required.

Thus, it can be seen that the embodiment hereinabove described provides for a fully closed carbon monoxide recycle system wherein initial carbon monoxide is used as a carrier gas, converted to nickel carbonyl and subsequently re-generated from the nickel carbonyl. The only material added and subsequently removed from the system is metallic nickel, which is added as powder and removed as an object or coating as nickel plate, foil and the like. Judicious selection of reactor temperatures, decomposition chamber temperatures and conduit temperatures enables proper utilization of the chemical reactants. Suitable gas pressures and flow rates are readily attained and controllable.

Use of a second stage double, in parallel, refrigeration unit system enables continuous operation of the process. Further, use of a third stage double, in parallel, refrigeration unit system further provides enhanced nickel carbonyl recovery values for recycle within the carbon monoxide fully closed system.

Although this disclosure has described and illustrated preferred embodiments of the invention, it is to be understood that the invention is not restricted to those particular embodiments. Rather, the invention includes all embodiments which are functional or mechanical equivalence of the specific embodiments and features that have been described and illustrated.

We claim:

1. An improved closed loop, carbon monoxide self-contained process for the production of nickel or a nickel-coated object by the nickel vapor deposition process, comprising (a) placing an object to be treated with nickel carbonyl by said nickel vapor deposition process in a deposition chamber;

(b) feeding a gaseous mixture comprising nickel carbonyl and carbon monoxide to said deposition chamber;

(c) depositing nickel on said object to produce said nickel or nickel-coated object in said chamber and a nickel carbonyl-depleted gaseous mixture;

(d) removing said nickel carbonyl-depleted gaseous mixture from said chamber;

(e) removing nickel carbonyl from said nickel carbonyl-depleted gaseous mixture in a primary nickel carbonyl condensation unit to produce a first reduced-concentration nickel carbonyl-containing gas; the improvement comprising (f) condensing said first reduced-concentration nickel carbonyl-containing gas in a secondary condensation unit operative in an alternate freeze-thaw mode by, stepwise, (i) freezing said first reduced-concentration nickel carbonyl-containing gas to produce a first solid nickel carbonyl;

(ii) melting said first solid nickel carbonyl to produce a first liquid nickel carbonyl;

(iii) removing said first liquid nickel carbonyl from said secondary condensation unit; to produce a second reduced concentration nickel carbonyl-containing gas having a nickel carbonyl concentration of less than 5 V/V %; and (g) feeding said second reduced-concentration nickel carbonyl-containing gas to a nickel carbonyl reactor containing nickel powder to produce a fresh gaseous mixture comprising fresh nickel carbonyl and carbon monoxide.

2. A process as defined in claim 1 for continuous operation comprising a plurality of said secondary condensation units linked in parallel arrangement and operating in alternate freeze-thaw modes.

3. A process as defined in claim 1 further comprising condensing said second reduced-concentration nickel carbonyl-containing gas in a tertiary condensation unit operative in an alternate freeze-thaw mode, by stepwise, (iv) freezing said second reduced-concentration nickel carbonyl-containing gas to produce a second solid nickel carbonyl;

(v) melting said second solid nickel carbonyl to produce a second liquid nickel carbonyl;

(vi) removing said second liquid nickel carbonyl from said tertiary condensation unit; to produce a third reduced-concentration nickel carbonyl-containing gas having a nickel carbonyl concentration of less than 500 p.p.m.; and (h) feeding said third reduced-concentration nickel carbonyl-containing gas to a nickel carbonyl reactor containing nickel powder to produce a further fresh gaseous mixture comprising nickel carbonyl and carbon monoxide.

4. A process as defined in claim 3 wherein said third reduced-concentration nickel carbonyl-containing gas has a nickel-carbonyl concentration of less than 200 p.p.m.

5. A process as defined in claim 3 further comprising condensing said second reduced-concentration nickel carbonyl-containing gas in said tertiary condensation unit at a pressure greater than 25 bar.

6. A process as defined in claim 3 further comprising recycling said nickel carbonyl obtained from any of steps (e), (iii), (vi), (g) and (h) to said deposition chamber.

7. A process as defined in claim 1 further comprising condensing said first reduced-concentration nickel carbonyl-containing gas in said secondary condensation unit at a pressure greater than 0.03 bar.

8. A method of recovering nickel carbonyl in a nickel deposition system which includes a reactor system, a plating system, a reclaim system and a vapor recovery system comprising the steps of producing liquid nickel carbonyl, vaporizing the liquid nickel carbonyl and applying the vaporized nickel carbonyl to a substrate to deposit nickel thereon and to release carbon monoxide, cooling gases after the deposition of nickel on said substrate to a temperature below the freezing point of nickel carbonyl to condense out nickel carbonyl to a solid; subsequently allowing said solid nickel carbonyl to melt and recovering liquid nickel carbonyl from said solid nickel carbonyl.

* * * * *